(12) United States Patent
Hishiya et al.

(10) Patent No.: US 7,208,428 B2
(45) Date of Patent: Apr. 24, 2007

(54) METHOD AND APPARATUS FOR TREATING ARTICLE TO BE TREATED

(75) Inventors: Shingo Hishiya, Nirasaki (JP); Yoshikazu Furusawa, Nirasaki (JP); Teruyuki Hayashi, Nirasaki (JP); Misako Saito, Nirasaki (JP); Kota Umezawa, Nirasaki (JP); Syoichi Sato, Machida (JP)

(73) Assignee: Tokyo Electron Limited, Tokyo (JP)

( * ) Notice: Subject to any disclaimer, the term of this patent is extended or adjusted under 35 U.S.C. 154(b) by 119 days.

(21) Appl. No.: 10/433,423

(22) PCT Filed: Dec. 4, 2001

(86) PCT No.: PCT/JP01/10594

§ 371 (c)(1), (2), (4) Date: Jun. 16, 2004

(87) PCT Pub. No.: WO02/47142

PCT Pub. Date: Jun. 13, 2002

(65) Prior Publication Data

US 2004/0219793 A1 Nov. 4, 2004

(30) Foreign Application Priority Data

Dec. 5, 2000 (JP) .............................. 2000-370023
Feb. 2, 2001 (JP) .............................. 2001-026233

(51) Int. Cl.
H01L 21/324 (2006.01)
H01L 21/477 (2006.01)

(52) U.S. Cl. .............................. 438/795; 257/E21.224; 257/E21.226

(58) Field of Classification Search ........ 257/E21.224, 257/E21.226; 438/795
See application file for complete search history.

(56) References Cited

U.S. PATENT DOCUMENTS 4,812,201 A   3/1989   Sakai et al.

(Continued)

FOREIGN PATENT DOCUMENTS

DE   199 24 058   11/2000

(Continued)

OTHER PUBLICATIONS

International Preliminary Examination Report (PCT/IPEA/409) (translated) issued for PCT/JP01/10594.

(Continued)

*Primary Examiner*—Asok Kumar Sarkar
(74) *Attorney, Agent, or Firm*—Smith, Gambrell & Russell, LLP

(57) ABSTRACT

A thermal treatment apparatus 1 includes a reaction tube 2 for containing wafers 10 contaminated with organic substances having a heater 12 capable of heating the reaction tube; a first gas supply pipe 13 for carrying oxygen gas into the reaction tube 2; and a second gas supply pipe 14 for carrying hydrogen gas into the reaction tube 2. Oxygen gas and hydrogen gas are supplied through the first gas supply pipe 13 and the second gas supply pipe 14, respectively, into the reaction tube 2, and the heater 12 heats the reaction tube 2 at a temperature capable of activating oxygen gas and hydrogen gas. A combustion reaction occurs in the reaction tube 2 and thereby the organic substances adhering to the wafers 10 are oxidized, decomposed and removed.

7 Claims, 9 Drawing Sheets

U.S. PATENT DOCUMENTS

| | | | |
|---|---|---|---|
| 5,200,031 A | 4/1993 | Latchford et al. | |
| 5,314,847 A | 5/1994 | Watanabe et al. | |
| 5,330,935 A | 7/1994 | Dobuzinsky et al. | |
| 5,567,271 A | 10/1996 | Chu et al. | |
| 5,762,755 A * | 6/1998 | McNeilly et al. | 438/708 |
| 5,813,851 A | 9/1998 | Nakao | |
| 5,920,799 A * | 7/1999 | Graves et al. | 438/798 |
| 6,287,991 B1 | 9/2001 | Takahashi | |
| 6,305,314 B1 * | 10/2001 | Sneh et al. | 118/723 R |
| 6,468,926 B1 | 10/2002 | Irino et al. | |

FOREIGN PATENT DOCUMENTS

| | | |
|---|---|---|
| EP | 0 469 157 | 2/1992 |
| JP | 48-72971 | 10/1973 |
| JP | 51-43079 | 4/1976 |
| JP | 60-57937 | 4/1985 |
| JP | 61-271821 | 12/1986 |
| JP | 61-284925 | 12/1986 |
| JP | 4-39931 | 2/1992 |
| JP | 4-290219 | 10/1992 |
| JP | 5-109686 | 4/1993 |
| JP | 9-167759 | 6/1997 |
| JP | 9-283509 | 10/1997 |
| JP | 10-189487 | 7/1998 |
| JP | 11-44443 | 2/1999 |
| JP | 11-288899 | 10/1999 |
| JP | 2000-21876 | 1/2000 |

OTHER PUBLICATIONS

Notification of Transmittal of Copies of Translation of the International Preliminary Examination Report (PCT/IB/338) issued for PCT/JP01/10594.

\* cited by examiner

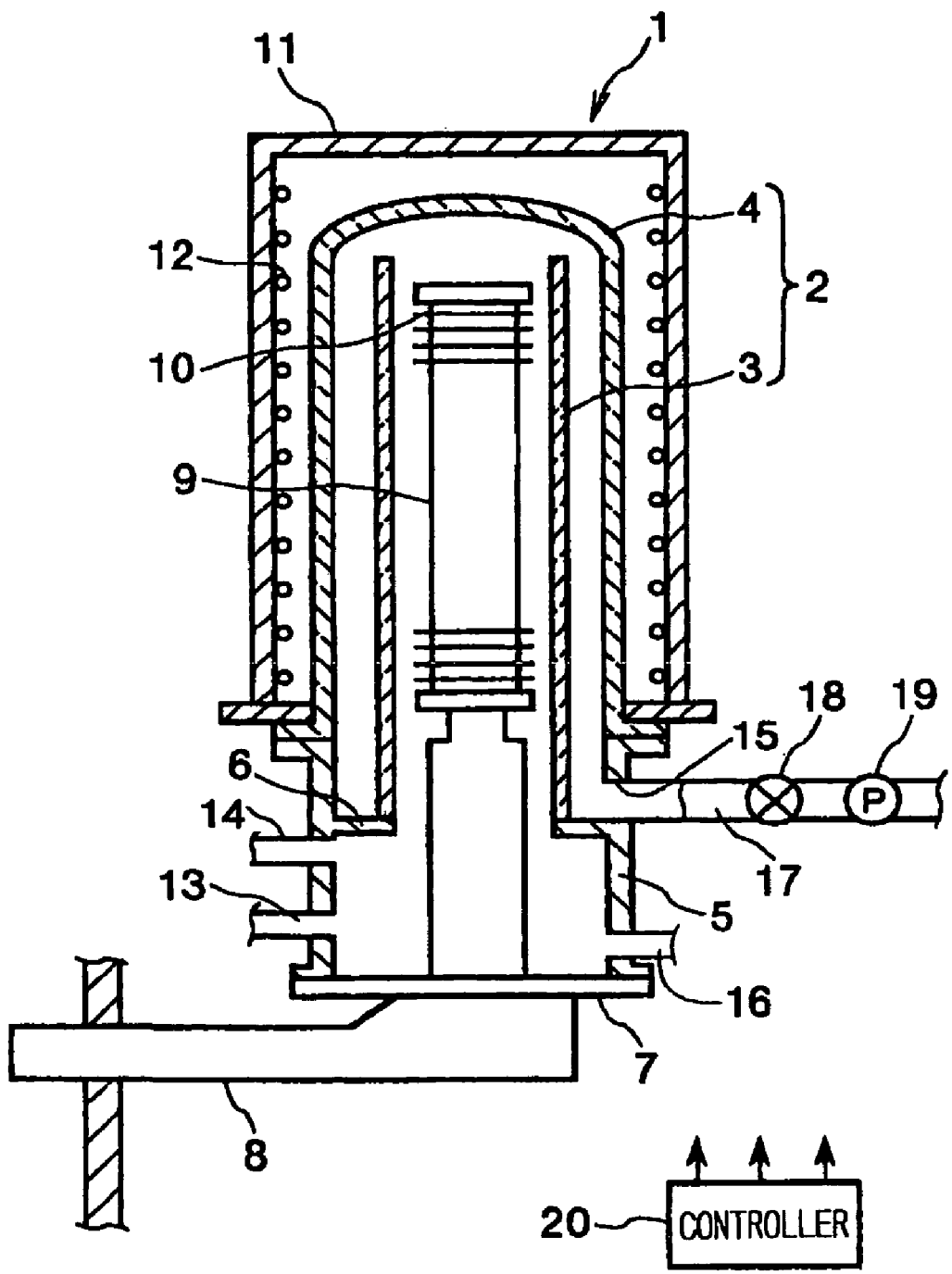
F I G. 1

METHOD AND APPARATUS FOR TREATING ARTICLE TO BE TREATED

BACKGROUND OF THE INVENTION

1. Field of the Invention

The present invention relates to a method and an apparatus for processing an object to be processed, such as a semiconductor wafer.

2. Description of the Related Art

A semiconductor device fabricating method, in general, includes a film forming process for forming a thin film, such as a polysilicon film or a silicon oxide film, on an object to be processed, such as a semiconductor wafer (hereinafter, referred to as "wafer") by, for example, CVD (chemical vapor deposition) or the like.

Generally, such a film forming process is carried out in a clean room to prevent the adhesion of contaminants to the wafer. It is difficult to clear the clean room completely of contaminants and the atmosphere of the clean room contains a very small quantity of organic substances (contaminants), such as tributyl phosphate (TBP), a siloxane and dioctyl phthalate (DOP). Consequently, in some cases, those organic contaminants adhere to the wafer. Formation of the thin film on the wafer thus contaminated with organic substances can deteriorate the characteristics of semiconductor devices and will reduce the yield of semiconductor devices. Therefore, the wafer is cleared of organic substances adhering thereto before forming the thin film on the wafer.

A cleaning method of cleaning a wafer is carried out by using, for example, a processing vessel 51 as shown in FIG. 9. A wafer 53 is mounted on a wafer support table 52 loaded into the processing vessel 51. Then, the wafer 53 is heated at a predetermined temperature of, for example, 600° C. by a heater 54 built in the wafer support table 52. Subsequently, a processing gas, such as oxygen gas, is supplied through a supply port 55 into the processing vessel 51. The oxygen gas supplied into the processing vessel 51 undergoes thermal decomposition in the vicinity of the wafer 53 and oxygen atom radicals (O*) are produced. The oxygen atom radicals decompose the organic substances adhering to the surface of the wafer 53. The thus decomposed organic substances are discharged from the processing vessel 51 through a discharge port 56. Thus, the wafer 53 is cleaned.

The allowable range of the quantity of organic substances adhering to the wafer 53 has been narrowed as the dimensions of device patterns shrinks to meet the increase of the number of components per semiconductor device. Thus, further efficient removal of organic substances from wafers is desired.

The aforementioned cleaning method needs to heat the interior of the processing vessel 51 (the wafer 53) at a high temperature of, for example, 600° C., to produce oxygen atom radicals, which is undesirable from the point of view of preventing the thermal oxidation of the wafer.

The aforementioned cleaning method takes much time for cleaning many wafers 53 because the aforementioned cleaning method cleans wafers 53 one at a time.

Moreover, it is possible that new organic substances adhere to a wafer 53 cleaned by the aforementioned cleaning method while the wafer 53 is carried to a thin film forming apparatus to form a thin film on the wafer.

SUMMARY OF THE INVENTION

The present invention has been made in view of the foregoing problems and it is therefore an object of the present invention to provide a method and an apparatus that improve the efficiency of removing organic substances adhering to an object to be processed.

A further object of the present invention is to provide a method and an apparatus capable of efficiently removing organic substances adhering to the object at comparatively low temperatures.

A further object of the present invention is to provide a method and an apparatus capable of removing organic substances adhering to the object in a short time.

A further object of the present invention is to provide a method and an apparatus capable of forming a thin film on the object cleared of organic substances.

A further object of the present invention is to provide a method and an apparatus capable of both removing organic substances from the object and forming a thin film on the object by using a single apparatus.

To achieve the above objectives, a processing method according to the first aspect of the present invention is characterized that it includes: a loading step of loading an object, to be processed, contaminated with an organic substance into a reaction chamber; and a removing step of removing the organic substance from the object by heating the reaction chamber at a predetermined temperature and supplying a processing gas into the reaction chamber; wherein the processing gas contains an oxidizing gas and a reducing gas, and the predetermined temperature at which the reaction chamber is heated is high enough to activate the oxidizing gas and the reducing gas.

This processing method supplies the processing gas containing the oxidizing gas and the reducing gas into the reaction chamber in which the object are held. A combustion reaction occurs in the reaction chamber to produce active oxygen species (O*) and active hydroxyl species (OH*). The active oxygen species and the active hydroxyl species oxidize and decompose the organic substance adhering to the object, so that the organic substances are removed from the object.

The oxidizing gas contains, for example, at least one of $O_2$, $N_2O$ and NO. The reducing gas contains, for example, at least one of $H_2$, $NH_3$ and $CH_4$.

Preferably, the temperature of the heated reaction chamber is 350° C. or above. The organic substance adhering to the object can be removed even if the temperature of the reaction chamber is lower than those used by conventional object processing methods.

Preferably, pressure in the reaction chamber is in the range of 133 to 399 Pa. The object can uniformly be exposed to the processing gas when the reaction chamber is at such a lower pressure.

A plurality of objects contaminated with the organic substance may be loaded into the reaction chamber. The organic substance can be removed from the plurality of objects by a single processing cycle, and hence the organic substances can be removed from the plurality of objects in a short time.

A processing apparatus according to the second aspect of the present invention is characterized in that it includes: a reaction chamber for containing an object to be processed, and provided with a heating unit capable of heating the reaction chamber at a predetermined temperature; a gas supplying means for supplying a processing gas containing an oxidizing gas and a reducing gas into the reaction chamber; a gas discharging means for discharging gases from the reaction vessel; and a control means for controlling the heating unit so as to heat the reaction chamber at a temperature high enough to activate the oxidizing gas and the reducing gas.

The processing gas supplying means of this apparatus supplies the processing gas containing the oxidizing gas and the reducing gas into the reaction chamber holding the object contaminated with the organic substance. The heating unit controlled by the control means heats the reaction chamber at a temperature high enough to activate the oxidizing gas and the reducing gas. A combustion reaction occurs in the reaction chamber to produce active oxygen species and active hydroxyl species. The active oxygen species and the active hydroxyl species oxidize and decompose the organic substances adhering to the object to remove the organic substances from the object.

The oxidizing gas contains, for example, at least one of $O_2$, $N_2O$ and NO. The reducing gas contains, for example, at least one of $H_2$, $NH_3$ and $CH_4$.

Preferably, the control means controls the heating unit such that the temperature of the heated reaction chamber is 350° C. or above. The organic substances adhering to the object can be removed even if the temperature of the reaction chamber is lower than those used by conventional processing apparatuses.

Preferably, the control means controls the gas discharging means to evacuate the reaction chamber such that the pressure in the reaction chamber is in the range of 133 to 399 Pa. The object can uniformly be exposed to the processing gas when the reaction chamber is at such a lower pressure.

Preferably, the reaction chamber has an object holding part capable of holding a plurality of objects, and the control means makes the processing gas supplying means supply the processing gas into the object holding part to remove organic substances from the plurality of objects. Thus, the organic substance can be removed from the plurality of objects by a single processing cycle, and hence the organic substance can be removed from the plurality of objects in a short time.

A processing method according to the third aspect of the present invention is characterized in that it includes: a loading step of loading an object, to be processed, contaminated with an organic substance into a reaction chamber; and removing the organic substance from the object by heating the reaction chamber at a predetermined temperature and supplying a processing gas into the reaction chamber; wherein the processing gas contains ozone, and the temperature of the heated reaction chamber is high enough to activate the ozone contained in the processing gas.

Thus, the processing method supplies the processing gas containing ozone into the reaction chamber in which the object is placed. The ozone contained in the processing gas supplied into the reaction chamber is activated to produce oxygen atom radicals. The oxygen atom radicals decompose the organic substance adhering to the object and thereby the organic substances are removed. Thus, the organic substances adhering to the object can be removed at an improved efficiency.

A plurality of objects contaminated with organic substance may be loaded into the reaction chamber. The organic substance can be removed from the plurality of objects by a single processing cycle, and hence the organic substances can be removed from the plurality of objects in a short time.

Preferably, the temperature of the heated reaction chamber is in the range of 300° C. to 500° C. The organic substance adhering to the object can be removed even if the temperature of the reaction chamber is lower than those used by conventional processing methods.

Preferably, pressure in the reaction chamber is in the range of 13.3 to 26,600 Pa. The object can uniformly be exposed to the processing gas when the reaction chamber is at such a lower pressure.

The organic substances include, for example, at least tributyl phosphate, a siloxane or dioctyl phthalate. It is preferable that the processing gas is supplied from a non-processing region on one side of a processing region (where the object is processed) so that the processing gas reaches the other side of the processing region, and that a gas existing in the processing chamber is discharged from a non-processing region on said one side of the processing region so that the processing gas having reached said other side of the processing region is supplied to the processing region.

In this case, the processing gas having reached said other side of the processing region can uniformly be distributed in the processing chamber by discharging said gas existing in the reaction chamber therefrom. The organic substance removed from the object by the processing gas is discharged from the reaction chamber.

The above method may further includes a film-forming step of forming a thin film on the object by supplying film-forming gases to the object after the organic substance have been removed. Preferably, the loading step of loading the object into the reaction chamber, the removing step of removing the organic substance from the object, and film-forming step of forming a thin film on the object are carried out by one and the same apparatus, which simplifies the formation of a thin film on the object, and eliminates the possibility of contaminating the object again with an organic substance in transferring the object from a cleaning process to a thin-film forming process. Preferably, a loading temperature at which the reaction chamber is heated when the object is loaded into the reaction chamber and the temperature at which the reaction chamber is heated for the step of removing the organic substance from the object are approximately equal, which makes temperature control unnecessary during the removal of the organic substance.

A processing apparatus according to a fourth aspect of the present invention is characterized in that it includes: a reaction chamber for containing an object, to be processed, and provided with a heating unit capable of heating the reaction chamber at a predetermined temperature; a processing gas supplying means for supplying a processing gas containing ozone into the reaction chamber; a gas discharging means for discharging gases from the reaction chamber; and a control means for controlling the heating unit so as to heat the reaction chamber at a temperature high enough to activate the ozone contained in the processing gas.

Thus, the processing gas supplying means of the processing apparatus supplies the processing gas containing ozone into the reaction chamber in which the object is placed. The control means controls the heating unit so as to heat the reaction chamber at a temperature high enough to activate the ozone contained in the processing gas supplied into the reaction chamber to produce oxygen atom radicals. The oxygen atom radicals decompose the organic substances adhering to the objects and thereby the organic substance is removed.

Preferably, the reaction chamber has an object holding part capable of holding a plurality of object, and the control means makes the processing gas supplying means supply the processing gas into the object holding part to remove organic substances from the plurality of objects. Thus, the organic substances can be removed from the plurality of objects by a single processing cycle, and hence the organic substances can be removed from the plurality of objects in a short time.

Preferably, the reaction chamber has a conductance capable of maintaining the ozone in an active state. A reaction chamber of, for example, single-tube construction meets such a requirement for maintaining the ozone in an active state.

Preferably, the control means controls the heating unit so as to heat the reaction chamber at a temperature in the range of, for example, 300° C. to 500° C. Even though the temperature of the reaction chamber is thus low, the organic substance adhering to the object can be removed at an improved efficiency.

Preferably, the control means controls the gas discharging means so as to evacuate the reaction chamber such that the reaction chamber is maintained at a pressure in the range of 13.3 to 26,600 Pa. The object can uniformly be exposed to the processing gas when the reaction chamber is at such a lower pressure.

Preferably, the processing gas supplying means is provided with an ozone generator including a plasma generator, and an ozone generating gas supply pipe, for supplying oxygen gas, and nitrogen gas or carbon dioxide, is connected to the ozone generator. The ozone generating efficiency of the ozone generator is improved when oxygen gas and nitrogen gas are supplied through the ozone producing gas supply pipe. A gas generated by the ozone generator does not contain $NO_x$ and the processing gas supply means for supplying the processing gas into the reaction chamber is not corroded easily when oxygen and carbon dioxide are supplied through the ozone producing gas supply pipe.

Preferably, the reaction chamber has a processing region in which an object is processed and a non-processing region at least on one side of the processing region, the processing gas supply means and the discharge means are arranged in the non-processing region on said one side of the processing region, the control means makes the processing gas supply means supply the processing gas such that the processing gas flows from the non-processing region and reaches a non-processing region on the other side the processing region and makes the gas discharging means evacuate the reaction chamber such that ozone having reached the non-processing region on said other side flows into the processing region. In this case, the processing gas supplied by the processing gas supply means and having reached the non-processing region on said other side is distributed uniformly in the processing region by the gas discharging means, and thereby organic substance is removed from the object by the processing gas and are discharged outside the reaction chamber.

The processing gas supply means is provided with a processing gas supply pipe for carrying the processing gas into the reaction chamber. Preferably, a tip part of the processing gas supply pipe is bent toward the non-processing region on said other side such that the processing gas supplied into the processing chamber flows from the non-processing region on said one side through a non-processing region toward the non-processing region on said other side. The processing gas supply pipe having the bent free end part increases the conductance of the reaction chamber.

The processing apparatus may further includes a film-forming gas supply means for supplying a film-forming gas into the reaction chamber, and a film formation control means for making the film-forming gas supply means supply the film-forming gas to the object cleared of the organic substance to form a thin film on the object.

BRIEF DESCRIPTION OF THE DRAWINGS

FIG. 1 is a schematic view of a processing apparatus in a first embodiment according to the present invention;

DESCRIPTION OF THE PREFERRED EMBODIMENTS

Figure 2:
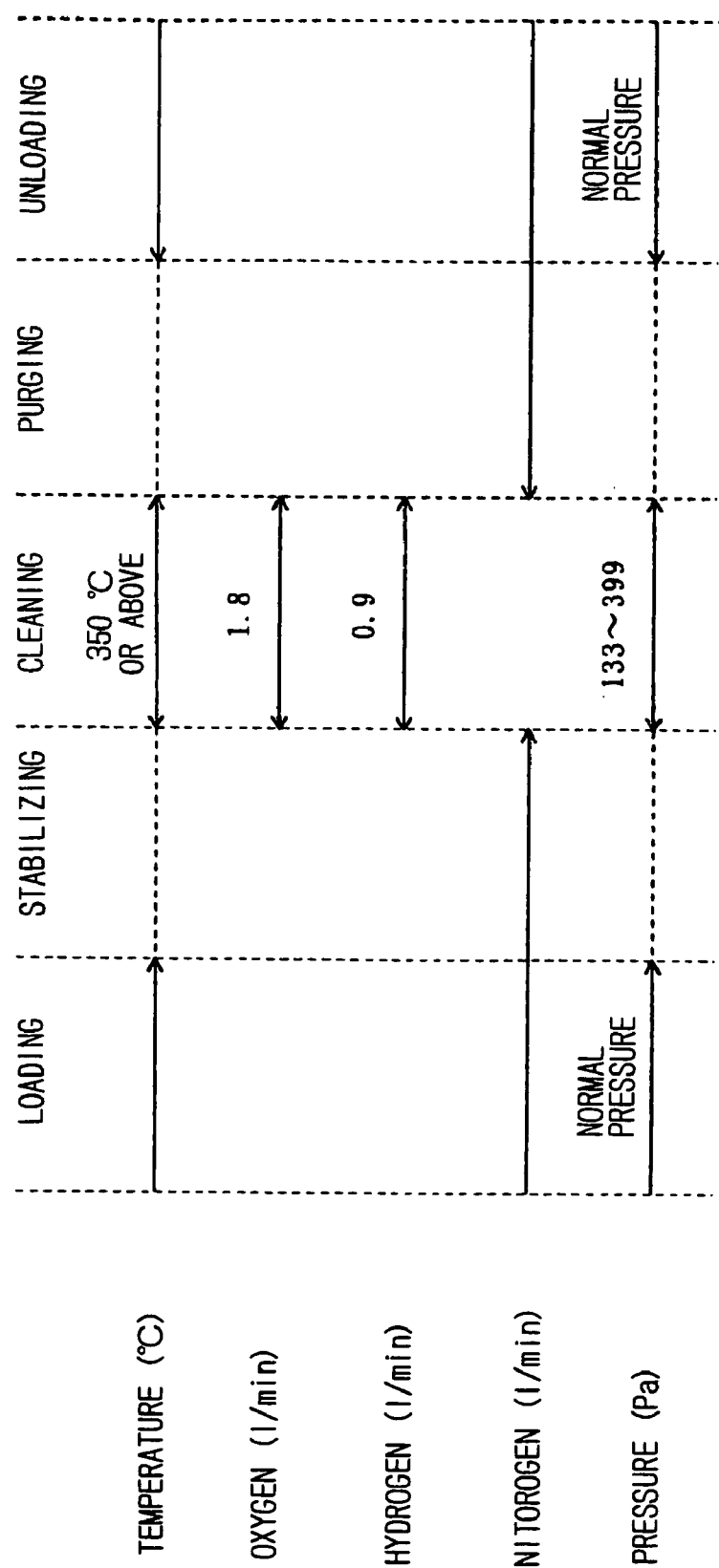
FIG. 2 is a diagram, showing a process recipe, of assistance in explaining a cleaning procedure to be carried out by the wafer processing apparatus shown in FIG. 1.

Preferred embodiments of the present invention will be described with reference to the accompanying drawings.

[First Embodiment]

A first embodiment of the present invention, in which organic substances adhering to semiconductor wafers (hereinafter referred to simply as "wafers"), i.e., objects to be processed, are decomposed and removed therefrom (namely, cleaned) by using a batch type vertical thermal treatment apparatus shown in FIG. 1, will be described Referring to FIG. 1, the thermal treatment apparatus 1 has a substantially cylindrical reaction tube 2 set with its axis extending vertically. The reaction tube 2 is a double-wall structure consisting of an inner tube 3 defining a film forming region therein, an outer tube 4 having a top wall and covering the inner tube 3 so as to define a space of a fixed thickness around the inner tube 3. The inner tube 3 and the outer tube 4 are formed of a heat-resistant material, such as quartz.

A cylindrical manifold 5 of a stainless steel is disposed underneath the outer tube 4. The manifold 5 is joined in an airtight fashion to the lower end of the outer tube 4. The inner tube 3 is supported on a support ring 6 formed integrally with the manifold 5 and projecting radially inward from the inner surface of the manifold 5.

A lid 7 is disposed under the manifold 5. A boat elevator 8 moves the lid 7 vertically. The lid 7 is raised to close the lower open end of the manifold 5.

A wafer boat 9 of quartz is mounted on the lid 7. The wafer boat 9 holds a plurality of wafers 10 in a vertical arrangement at predetermined intervals.

A heat-insulator 11 surrounds the reaction tube 2. A heater 12 having a resistance heating element is held on the inner surface of the side wall of the heat-insulator 11 to heat the reaction tube 2. The heater 12 heats the interior of the reaction tube 2 at a predetermined temperature.

A plurality gas supply pipes penetrate the side wall of the manifold 5. In the first embodiment, a first gas supply pipe 13 and a second gas supply pipe 14 penetrate the side wall of the manifold 5.

The first gas supply pipe 13 opens into the interior of the inner tube 3. As shown in FIG. 1, the first gas supply pipe 13 penetrates a part, below the support ring 6 (below the inner tube 3), of the side wall of the manifold 5. The first gas supply pipe 13 carries an oxidizing gas, such as oxygen gas ($O_2$), into the inner tube 3.

The second gas supply pipe 14 opens into the interior of the inner tube 3. The second gas supply pipe 14, similarly to the first gas supply pipe 13, penetrates a part, below the support ring 6 (below the inner tube 3), of the side wall of the manifold 5. The second gas supply pipe 14 carries a reducing gas, such as hydrogen gas ($H_2$), into the inner tube 3.

A discharge port 15 is formed in a part, above the support ring 6, of the side wall of the manifold 5. The discharge port 15 communicates with a space between the inner tube 3 and the outer tube 4 of the reaction tube 2. Oxygen gas and hydrogen gas are supplied through the first gas supply pipe 13 and the second gas supply pipe 14, respectively, into the inner tube 3 for a cleaning step. Organic substances decomposed by the cleaning step flow through the space between the inner tube 3 and the outer tube 4 and are discharged through the discharge port 15. A purge gas supply pipe 16 for carrying nitrogen gas as a purge gas penetrates a part, below the discharge port 15, of the side wall of the manifold 5.

A discharge pipe 17 is connected to the discharge port in an airtight fashion. The discharge pipe 17 is provided with a valve 18 and a vacuum pump 19. The valve 18 regulates the flow of gases in the discharge pipe 17 to maintain the internal pressure of the reaction tube 2 at a predetermined level. The vacuum pump 19 operates to draw gasses off the reaction tube 2 through the discharge pipe 17 and to regulate the internal pressure of the reaction tube 2.

A controller 20 is connected to the boat elevator 8, the heater 12, the first gas supply pipe 13, the second gas supply pipe 14, the purge gas supply pipe 16, the valve 18 and the vacuum pump 19. The controller 20 includes a microprocessor, a process controller and such. Temperatures, pressures and such in parts of the thermal treatment apparatus 1 are measured to obtain measured data. The controller 20 provides control signals to control the components of the thermal treatment apparatus 1 on the basis of the measured data.

A cleaning method to be carried out by the thermal treatment apparatus 1 to clean wafers 10 of organic substances adhering to the wafers 10 will be described with reference to a process recipe (a time sequence diagram) shown in FIG. 2. The cleaning method uses a processing gas containing oxygen gas and hydrogen gas for cleaning. The controller 20 controls the operations of the components of the thermal treatment apparatus 1.

The lid 7 is lowered, and the wafer boat 9, holding wafers 10 contaminated with organic substances, is mounted on the lid 7. In the meantime, the heater 12 heats the reaction tube 2 so that the interior of the reaction tube 2 is heated at a predetermined loading temperature.

Then, the boat elevator 8 raises the lid 7 to load the wafer boat 9 holding the wafers 10 into the inner tube 3 of the reaction tube 2 and to seal the reaction tube 2. A predetermined quantity of nitrogen gas is supplied through the purge gas supply pipe 16 into the reaction tube 2, and gases are discharged from the reaction tube 2 by operating the vacuum pump 19 and regulating the opening of the valve 18. The gases are discharged from the reaction tube 2 such that the internal pressure of the reaction vessel is in the range of, for example, 133 to 399 Pa (1 to 3 torr).

The heater 12 heats the interior of the reaction tube 2 up to 350° C. or above at which the oxidizing gas, i.e., oxygen gas, and the reducing gas, i.e., hydrogen gas, are activated. This is because oxygen gas and hydrogen gas cannot be activated if the internal temperature of the reaction tube 2 is below 350° C. However, if the reaction tube 2 is heated at an excessively high temperature, the surfaces of the wafers 10 are oxidized. Therefore, the reaction tube 2 is heated at temperatures, preferably, in the range of 350° C. to 600°, more preferably, in the range of 350° C. to 400° C. Evacuating and heating operations are continued until the interior of the reaction tube 2 is stabilized at a predetermined pressure and a predetermined temperature (Stabilizing Step).

After the interior of the reaction tube 2 has been stabilized at the predetermined pressure and the predetermined temperature, the supply of nitrogen gas through the purge gas supply pipe 16 is stopped. Then, oxygen gas and hydrogen gas are supplied through the first gas supply pipe 13 and the second gas supply pipe 14 at predetermined flow rates, respectively, into the space in the inner tube 3 of the reaction tube 2. The predetermined flow rate of oxygen gas is, for example, 1.8 l/min, and the predetermined flow rate of hydrogen gas is, for example, 0.9 l/min.

The oxygen gas and the hydrogen gas supplied into the reaction tube 2 are activated, and the combustion of the hydrogen gas expressed by the following chemical equations proceeds in the inner tube 3.

$$H_2+O_2 \rightarrow H^*+HO_2$$

$$H_2+OH^* \rightarrow H^*+H_2O$$

$$O_2+H^* \rightarrow OH^*+O^*$$

$$H_2+O^* \rightarrow H^*+OH^*$$

Thus, O* (active oxygen species) and OH* (active hydroxyl species) produced by the combustion of hydrogen gas decompose the organic substances adhering to the wafers 10 to clear the wafers 10 of the organic substances (Cleaning Step). The organic substances thus removed from the wafers 10 are sucked through the discharge port 15 into the discharge pipe 17 and are discharged outside the reaction tube 2.

Since the interior of the reaction tube 2 is maintained at the low pressure in the range of 133 to 399 Pa (1 to 3 torr), all the wafers 10 held by the wafer boat 9 are exposed uniformly to O* and OH*.

After the wafers 10 have been cleared of the organic substances, the supply of the processing gases (i.e., oxygen gas and hydrogen gas) through the first gas supply pipe 13 and the second gas supply pipe 14 is stopped. The vacuum pump 19 is operated while the opening of the valve 18 is controlled to exhaust gases from the reaction tube 2. Subsequently, a predetermined quantity of nitrogen gas is supplied through the purge gas supply pipe 16 into the reaction tube 2 to evacuate the reaction tube 2 through the discharge pipe 17 for purging (Purging Step). Preferably, a purge cycle including supplying nitrogen gas into the reaction tube 2 and discharging gases from the reaction tube 2 is repeated plural times to ensure that the reaction tube 2 is purged of gases completely.

A predetermined quantity of nitrogen gas is supplied last through the purge gas supply pipe 16 into the reaction vessel to set the interior of the reaction tube 2 at the normal pressure (760 torr), and the wafer boat 9 holding the wafers 10 is unloaded from the reaction tube 2 (Unloading Step).

Sample wafers 10 contaminated with organic substances were subjected to cleaning under various conditions. Sample wafers 10 contaminated with organic substances were prepared by forming a 1000 Å thick oxide film on each of wafers 10, cleaning the surfaces of the oxide films for 1 min with dilute hydrofluoric acid (DHF), and keeping the wafers 10 for a predetermined time in a clean room.

The quantity of adhering organic substances was assessed by a contact angle method. The contact angle method drops a pure water drop on the sample wafer 10, and measures the contact angle between the surface of the sample wafer 10 and the pure water drop. The greater the amount of the organic substances adhering to the sample wafer 10, the higher the hydrophobicity of the surface of the sample wafer 10 and the greater is the contact angle. The smaller the amount of the organic substance adhering to the sample wafer, the higher is the hydrophylicity of the surface of the sample wafer 10 and the smaller is the contact angle.

Contact angles at five points on the sample wafer 10 were measured, and the mean of the measured contact angles was calculated. The contact angles of the sample wafers 10 were 57°. The contact angle between a pure water drop and the surface of a wafer 10 completely cleared of organic substances is not 0° and it is difficult to measure small contact angles. Therefore, it was assumed that the wafers 10 were cleared substantially completely of organic substances when the contact angle was 2° or below.

TABLE 1

|  | Temperature (° C.) | Pressure (Pa) | Time (min) | Number of Wafers | Contact Angle (deg) |
| --- | --- | --- | --- | --- | --- |
| Example-1 | 350 | 133 | 30 | 3 | 1.2 |
| Example-2 | 400 | 133 | 30 | 3 | 1.2 |
| Example-3 | 350 | 200 | 30 | 3 | 1.2 |
| Example-4 | 350 | 266 | 30 | 3 | 1.4 |
| Example-5 | 350 | 399 | 30 | 3 | 1.8 |
| Example-6 | 350 | 200 | 10 | 3 | 1.3 |
| Example-7 | 350 | 200 | 1 | 3 | 1.3 |
| Example-8 | 350 | 200 | 30 | 100 | 1.3 |
| Comparative Example-1 | 300 | 133 | 30 | 3 | 56.5 |
| Comparative Example-2 | 330 | 133 | 30 | 3 | 53 |
| Not-Processed | — | — | — | — | 57 |

Figure 3:
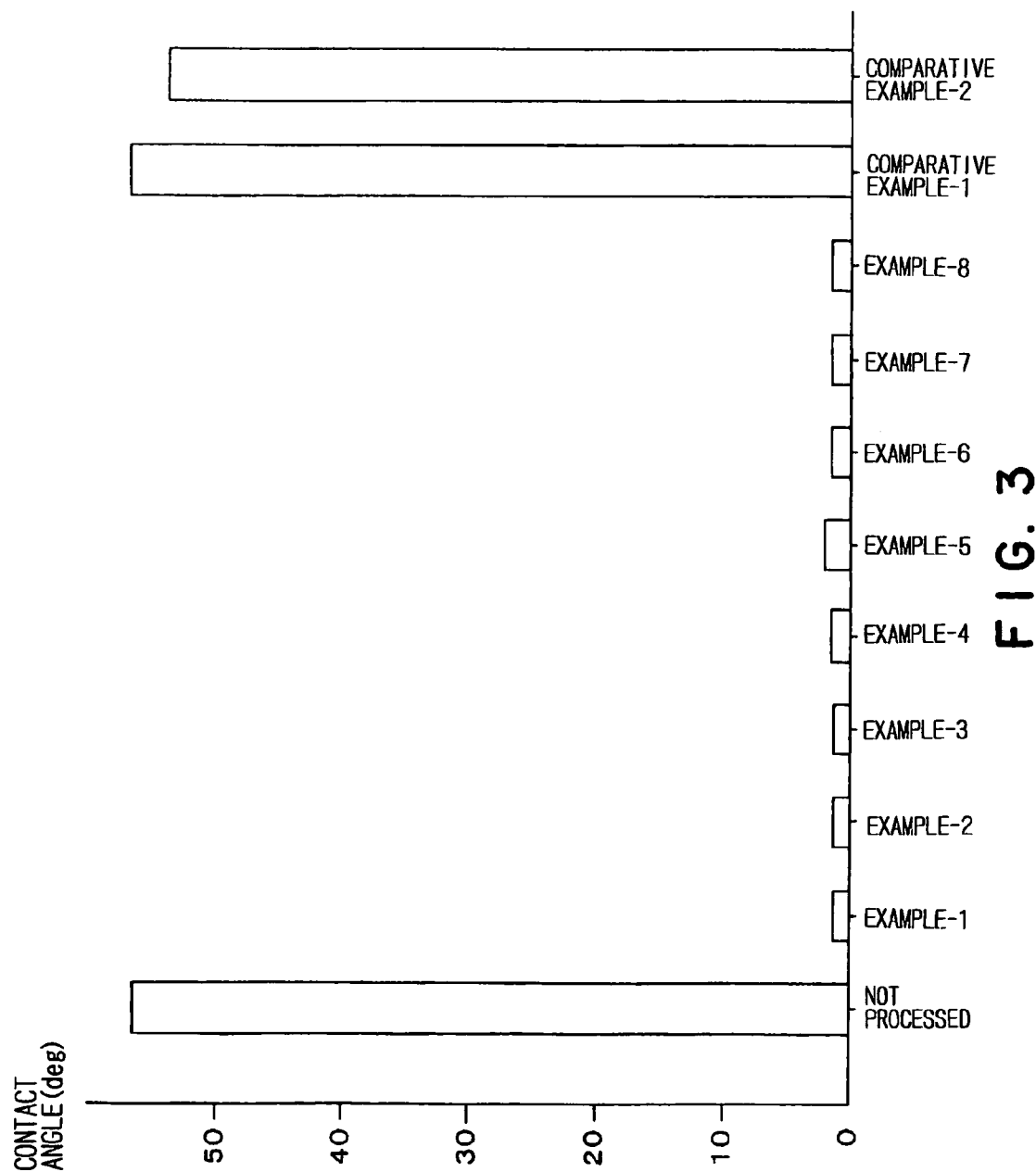
FIG. 3 is a graph showing the quantities of organic substances (contact angles) remaining on the wafers having been cleaned under respective cleaning conditions listed in Table 1.

Cleaning conditions are listed in Table 1. As shown in Table 1, the wafers in Examples 1 and 2 and Comparative examples 1 and 2 were cleaned by heating the reaction tube 2 at different temperatures, the wafers in Examples 3 to 5 were cleaned by setting the reaction tube 2 at different internal pressures, and the wafers in Examples 6 and 7 were cleaned for different cleaning times, respectively, to examine the influence of temperature, pressure and cleaning time on cleaning effect. To simplify experiments, three wafers in each of the examples and the comparative examples, excluding Example 8, were placed at a top position, a middle position and a bottom position, respectively, on the wafer boat 9 for cleaning. The contact angle shown in Table 1 in each of the examples and the comparative examples is the mean of measured contact angles for respective three wafers. The cleaning effect when many wafers 10 are cleaned simultaneously can be known from the result of Example 8. Measured contact angles are shown in Table 1 and FIG. 3. FIG. 3 is a bar graph of showing the mean contact angles in the examples and the comparative examples. Table 1 and FIG. 3 also show the contact angle when the wafer not subjected to the cleaning process, for reference.

As obvious from Table 1 and FIG. 3, the wafers 10 in Examples 1 and 2 processed at 350° C. and 400° C., respectively, in the reaction tube 2 were substantially completely cleaned of the organic substances. The organic substances could not be removed from the wafers 10 in Comparative examples 1 and 2 processed at 300° C. and 330° C., respectively, in the reaction tube 2. It is known from the measured results that the organic substances cannot be removed from wafers because the internal temperature of the reaction tube 2 below 350° C. cannot activate oxygen gas and hydrogen gas to produce O* and OH* and hence organic substances cannot be decomposed. Although it is possible to remove organic substances from the wafers 10 when the reaction tube 2 is heated so that the internal temperature of the reaction tube 2 is 350° or above, the surfaces of the wafers 10 are oxidized when the internal temperature of the reaction tube 2 is excessively high. Therefore, the internal temperature of the reaction tube 2 is preferably in the range of 350° C. to 600° C., more preferably, in the range of 350° C. to 400° C.

As obvious from Table 1 and FIG. 3, the wafers 10 in Examples 1 and 3 to 5 processed at pressures in the range of 133 to 399 Pa in the reaction tube 2 were substantially completely cleaned of the organic substances. Since it is possible that the wafers 10 held on the wafer boat 9 cannot uniformly be exposed to O* and OH* when the internal pressure of the reaction tube 2 is higher than 399 Pa, the preferable internal pressure of the reaction tube 2 is in the range of 133 to 399 Pa.

As obvious from Table 1 and FIG. 3, the wafers 10 in Examples 1, 6 and 7 processed by the cleaning process for cleaning times in the range of 1 to 30 min were substantially completely cleaned of the organic substances. There is the possibility that the organic substances cannot substantially be removed from the wafers 10 when the cleaning time is shorter than 1 min, and the wafers 10 cannot efficiently be cleaned when the cleaning time is longer than 30 min. Therefore, it is preferable that the cleaning time is in the range of 1 to 30 min. However, the cleaning time may be extended or shortened depending on the amount of organic substances adhering to the wafer.

As obvious from the contact angle between pure water and the wafers 10 in Example 8 shown in Table 1 and FIG. 3, increase in the number of the wafers 10 from three to hundred did not affect the organic substance removing effect of the cleaning method. The cleaning effect is in susceptible to the variation of the number of simultaneously cleaned wafers when the internal pressure of the reaction tube 2 is low. Thus, even if the number of simultaneously processed wafers 10 is large, such as hundred pieces, the influence of pressure of the reaction tube and cleaning time on cleaning effect is similar to that mentioned above.

Contact angle measurement is susceptible to the condition of a plane (the surface of the wafer 10) onto which a pure water drop is dropped and it is considered that the amount of organic substances adhering to the wafer 10 cannot accurately be measured if the cleaning process changes the shape of the surface of the wafer 10. The shapes of the surfaces of the wafers were examined before and after processing the wafers by the cleaning process. The examination proved that the cleaning process changes the shapes of the surfaces of the wafers scarcely.

As apparent from the foregoing description, the batch type vertical thermal treatment apparatus 1 in the first embodiment is capable of removing organic substances adhering to wafers 10 from the wafers 10 by supplying oxygen gas through the first gas supply pipe 13 and hydrogen gas through the second gas supply pipe 14 into the reaction tube 2 heated at a temperature not lower than 350° C. Thus, organic substances can satisfactorily be removed from the wafers 10 by the thermal treatment apparatus 1 of simple construction. The aforementioned method is capable of removing organic substances from the wafers 10 at lower process temperatures, as compared with the conventional cleaning method. Since the thermal treatment apparatus 1 in the first embodiment does not need an ozone generator including an ultraviolet illuminating device or a plasma generator, which is necessary for carrying out a cleaning process using ozone gas (mentioned later), the thermal treatment apparatus 1 is simple in construction.

The thermal treatment apparatus 1 in the first embodiment is capable of removing organic substances from a plurality of wafers 10 held on the wafer boat 9 at one time, and hence many wafers 10 can be cleaned in a short time.

Possible modifications in the first embodiment will be described.

The first embodiment uses oxygen gas as the oxidizing gas and hydrogen gas as the reducing gas. The oxidizing gas may be at least one of $O_2$, $N_2O$ and NO, and the reducing gas may be at least one of $H_2$, $NH_3$ and $CH_4$. Organic substances adhering to the wafers 10 can be removed from the wafers 10 by using the active oxygen species and active hydroxyl species produced by the combustion of the reducing gas. The organic substances can be removed from the wafers 10 under the same cleaning conditions including the internal temperature and the internal pressure of the reaction tube 2, when an oxidizing gas other than oxygen gas and a reducing gas other than hydrogen gas are used.

Although the thermal treatment apparatus 1 in the first embodiment for removing organic substances from wafers 10 is provided with the double-wall reaction tube 2 consisting of the inner tube 3 and the outer tube 4, a thermal treatment apparatus provided with a single-wall reaction vessel not provided with any parts corresponding to the inner tube 3 and the support ring 6 of the thermal treatment apparatus 1 shown in FIG. 1 may be used. The thermal treatment apparatus provided with the single-wall reaction vessel is simple in construction.

Although the aforementioned wafer cleaning method of removing organic substances from wafers 10 is carried out by the batch type vertical thermal treatment apparatus 1, the wafer cleaning method may be carried out by a single-wafer thermal treatment apparatus. The single-wafer thermal treatment apparatus is simple in construction and is capable of removing organic substances from wafers 10 at a low process temperature.

The thermal treatment apparatus 1 may be provided with a plurality of first gas supply pipes 13 and a plurality of second gas supply pipes 14. The objects, to be processed, are not limited to the wafers 10, and may be glass substrates, for example.

[Second Embodiment]

A second embodiment of the present invention, in which organic substances adhering to wafers (i.e., objects to be processed) are decomposed and removed therefrom (namely, cleaned) by means of a processing gas containing ozone by using a batch type vertical thermal treatment apparatus shown in FIG. 4, will be described.

Figure 4:
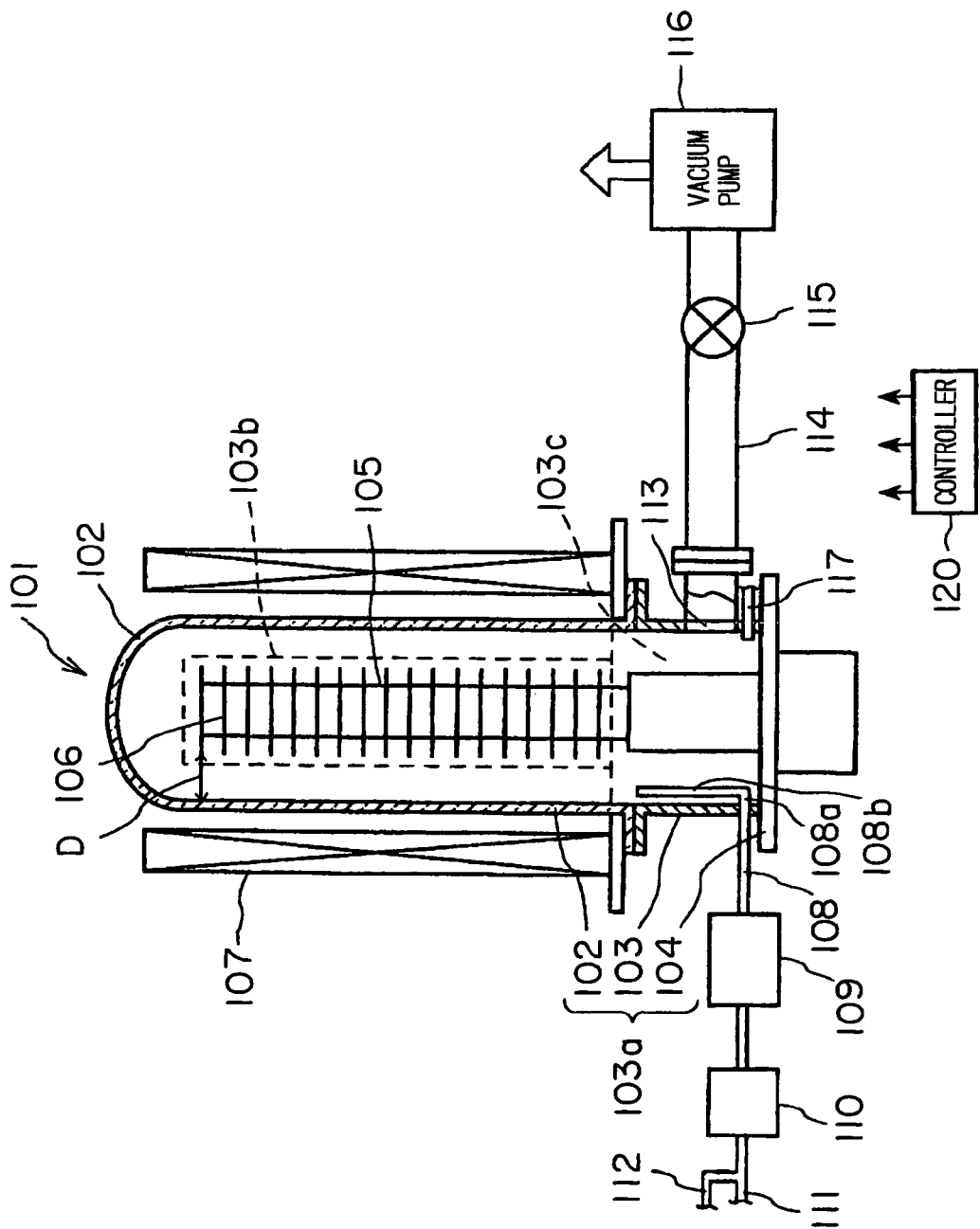
FIG. 4 is a schematic view of a processing apparatus in a second embodiment according to the present invention.

Referring to FIG. 4, the thermal treatment apparatus 101 has a substantially cylindrical reaction vessel 102 set with its axis extending vertically. The reaction vessel 102 is a single-wall cylindrical structure having a top wall. The reaction vessel 102 is formed of a heat-resistant material, such as quartz.

A cylindrical manifold 103 of a stainless steel is disposed underneath the reaction vessel 102. The manifold 103 is joined in an airtight fashion to the lower end of the reaction vessel 102

A lid 104 is disposed under the manifold 103. A boat elevator, not shown, moves the lid 104 vertically. The lid 104, the reaction vessel 102 and the manifold 103 form a processing chamber 103a. The lid 104 is raised so as to close the lower open end of the manifold 103 to seal the processing chamber 103a.

A wafer boat 105 of quartz is mounted on the lid 104. The wafer boat 9 holds a plurality of wafers 106 in a vertical arrangement at predetermined intervals. The wafer boat 105 is inserted in the reaction vessel 102 to place the wafers 106 in a processing region 103b in the processing chamber 103a. A non-processing region surrounds the processing region 103b.

The reaction vessel 102 is formed in dimensions such that a space D is formed between the inner surface of the side wall of the reaction vessel 102 and the edges of the wafers 106 held on the wafer boat 105 inserted in the reaction vessel 102. The space D is formed in a thickness in the range of, for example, about 20 to about 50 mm and is determined taking into consideration the flow rate of ozone, the internal pressure of the reaction vessel 102 and the height of the reaction vessel 102 so that a predetermined discharge conductance is available in the processing chamber 103a.

A heater 107 having a resistance heating element surrounds the reaction vessel 102 to heat the interior of the reaction vessel 102 at a predetermined temperature.

A processing gas supply pipe 108 is laid in a non-processing region 103c on one side of the processing region 103b (on the lower side of the processing region 103b in this embodiment). In the illustrated embodiment, the processing gas supply pipe 108 penetrates the side wall of the manifold 103. The processing gas supply pipe 108 is formed of Teflon® resistant to corrosion. The processing gas supply pipe 108 has a tip part 108a having a processing gas jetting part 108b bent so as to extend toward the processing region 103b to jet the processing gas containing ozone upward into the processing region 103b in the reaction vessel 102. The tip part 108a is arranged so that the processing gas jetted upward from the processing gas supply pipe 108 flows through a space outside the processing region 103b, such as the space D shown in FIG. 4, into a region on the other side of the processing region 103b, i.e., a region in an upper part of the reaction vessel 102.

The processing gas supply pipe 108 is connected to an ozone generator 109. The ozone generator 109 includes, for example, a plasma generator and is capable of producing ozone from oxygen gas. The ozone generator 109 is connected through a purifier 110 to an oxygen gas supply pipe 111 and an addition gas supply pipe 112. Oxygen gas and an addition gas, such as nitrogen gas or carbon dioxide gas, are supplied through the oxygen gas supply pipe 111 and the addition gas supply pipe 112, respectively, to the purifier 110. The purifier 110 purifies the oxygen gas and the addition gas suitable for ozone generation (so as to suppress the production of impurities, specifically, corrosive gases produced due to existence of moisture), and the purified gases is supplied to the ozone generator 109.

A discharge port 113 is formed opposite to the processing gas supply pipe 108 with respect to the non-processing region 103c in a part, corresponding to the non-processing region 103c, of the side wall of the manifold 103. Gases are discharge from the reaction vessel 102 through the discharge port 113.

A discharge pipe 114 is connected in an airtight fashion to the discharge port 113. A combination valve 115 and a vacuum pump 116 are arranged in that order with respect to the flowing direction of gases through the discharge pipe 114 in the discharge pipe 114. The opening of the combination valve 115 is adjusted so that pressures in the reaction vessel 102 and the discharge pipe 114 coincide with a predetermined pressure. The vacuum pump 116 sucks gases from the reaction vessel 102 through the discharge pipe 114, and regulates the pressures in the reaction vessel 102 and the discharge pipe 114.

A purge gas supply pipe 117 for carrying a purge gas, such as nitrogen gas, penetrates a part, below the discharge port 113, of the side wall of the manifold 103.

A controller 120 is connected to the ozone generator 109, the purifier 110, the oxygen gas supply pipe 111, the addition gas supply pipe 112, the combination valve 115, the vacuum pump 116 and the purge gas supply pipe 117. The controller 120 includes a microprocessor, a process controller and such. Temperatures, pressures and such in parts of the thermal treatment apparatus 101 are measured to obtain measured data. The controller 120 provides control signals to control the components of the thermal treatment apparatus 101 on the basis of the measured data.

Figure 5:
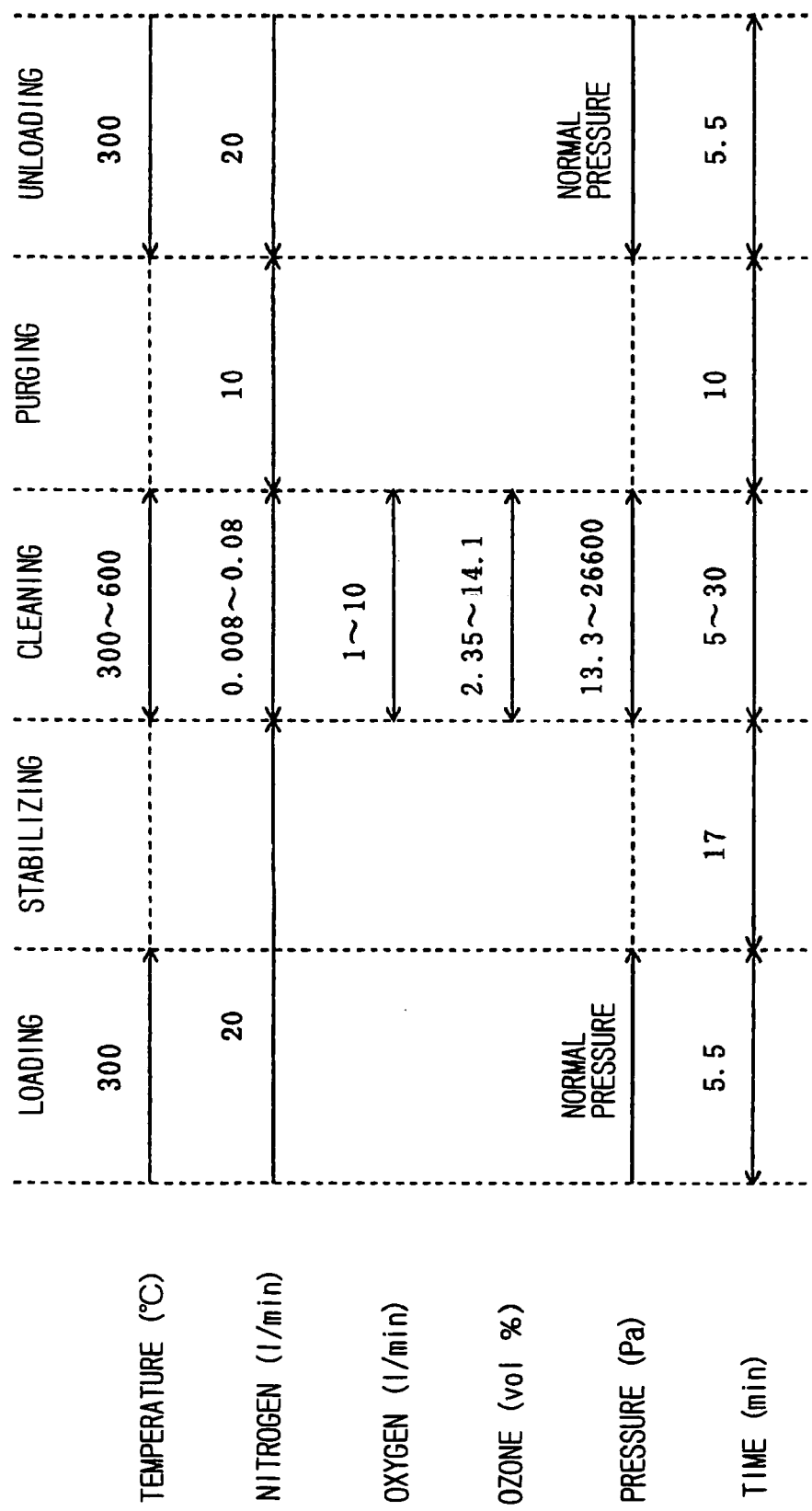
FIG. 5 is a diagram, showing a process recipe, of assistance in explaining a cleaning procedure to be carried out by the wafer processing apparatus shown in FIG. 4.

A cleaning method to be carried out by the thermal treatment apparatus 101 to clean wafers 106 of organic substances adhering to the wafers 106 will be described with reference to a process recipe (a time sequence diagram) shown in FIG. 5. The controller 120 controls the operations of the components of the thermal treatment apparatus 101.

The lid 104 is lowered and the wafer boat 105 holding wafers 106 contaminated organic substances is mounted on the lid 104. In the meantime, the heater 107 heats the reaction vessel 102 so that the interior of the reaction vessel 102 is heated at a predetermined loading temperature of, for example, 300° C.

Then, the boat elevator, not shown, raises the lid 104 to load the wafer boat 105 holding the wafers 106 into the processing chamber 103a and to seal the processing chamber 103a. Nitrogen gas ($N_2$) is supplied through the purge gas supply pipe 117 at a predetermined flow rate of, for example, 20 l/min into the processing chamber 103a to discharge contaminants remaining in the processing chamber 103a. Nitrogen gas is thus supplied for a predetermined time of, for example, 5.5 min (Loading Step).

Subsequently, the evacuation of the processing chamber 103a is started. Nitrogen gas is supplied at a predetermined flow rate of, for example, 20 l/mm through the purge gas supply pipe 117 into the processing chamber 103a, the opening of the combination valve 115 is controlled, and the vacuum pump 116 is operated to evacuate the processing chamber 103a until the internal pressure of the processing chamber 103a changes from the normal pressure to a predetermined pressure in the range of, for example, 13.3 to 26,600 Pa (0.1 to 200 torr). The heater 107 heats the processing chamber 103a at a predetermined temperature (cleaning temperature) in the range of, for example, 300° C. to 600° C. Evacuating and heating operations are continued for a predetermined time of, for example, about 17 mm until the processing chamber 103a is stabilized at a predetermined pressure and a predetermined temperature (Stabilizing Step).

After the processing chamber 103a has been stabilized at the predetermined pressure and the predetermined temperature, the supply of nitrogen gas through the purge gas supply pipe 117 is stopped. Then, oxygen gas and nitrogen gas are supplied through the oxygen supply pipe 111 and the addition gas supply pipe 112 at predetermined flow rates in the ranges of, for example 1 to 10 l/min and 0.008 to 0.08 l/min, respectively, into the purifier 110. The purifier adjusts the oxygen gas and the nitrogen gas to conditions suitable for ozone generation, and supplies the oxygen gas and the nitrogen gas to the ozone generator 109.

The plasma generator, not shown, of the ozone generator 109 applies a plasma to the oxygen gas to generate ozone. The ozone generator 109 supplies a processing gas having a predetermined ozone concentration in the range of, for example, 50 to 300 g/$Nm^3$ (2.35% to 14.1% by volume) at a predetermined flow rate in the range of, for example, about 1 to 10 l/min through the processing gas supply pipe 108 having the gas jetting part 8b into the processing chamber 103a so that the processing gas is able to flow into a space above the top of the wafer boat 105 under the top wall of the reaction vessel 102. The processing gas is supplied into the processing chamber 103a for a time in the range of, for example, 5 to 30 min (Cleaning Step).

Nitrogen gas supplied in addition to oxygen gas to the ozone generator 109 connected to the processing gas supply pipe 108 improves ozone generating efficiency. Although the processing gas contains $NO_x$ because nitrogen gas is supplied to the ozone generator 109, the processing gas supply pipe 108 formed of Teflon® is not easily corroded by $NO_x$. Consequently, there is little possibility of contaminants produced due to the corrosion of the processing gas supply pipe 108 flowing into the processing chamber 103a.

Since the processing chamber 103a is heated at a temperature in the range of 300° C. to 600° C., the ozone contained in the processing gas supplied into the processing chamber 103a is activated to produce oxygen radicals (O*). Thus, the processing gas containing oxygen radicals flows toward the top of the reaction vessel 102.

Since the reaction vessel 102 is a single-wall structure and the space D is formed between the inner surface of the side wall of the reaction vessel 102 and the edges of the wafers 106, a predetermined discharge conductance is available and hence ozone is not easily deactivated and can be maintained in an activated state. The processing chamber 103a can easily be kept at a low pressure. The tip part 108a is bent to jet the processing gas so that the processing gas flows through the region outside the processing region 103b toward the upper end of the reaction vessel 102. Therefore, conductance in the processing chamber 103a can be improved, the ozone can be maintained in an activated state, and the processing chamber 103a can easily be maintained at a low pressure.

The processing gas reached the top wall of the reaction vessel 102 is caused to flow into the processing region 103b by the agency of suction produced by the vacuum pump 116. Since the processing chamber 103a is maintained at a lower pressure in the range of 13.3 to 26,600 Pa (0.1 to 200 torr), the processing gas can be uniformly distributed in the processing region 103b. Since the processing gas flows via the top wall of the reaction vessel 102 into the processing region 103b, the processing gas can uniformly be distributed in the processing region 103b because the velocity of the processing gas decreases before the same flows into the processing region 103b and hence does not affect the distribution of the processing gas in the processing region 103b.

Since the discharge port 113 is opposite to the processing gas supply pipe 108, the flow of the processing gas into the processing region 103b is not affected easily by the processing gas supplied through the processing gas supply pipe 108, and hence discharge conductance in the processing chamber 103a can be improved. Thus, the ozone can be maintained in an activated state and the processing gas can uniformly be distributed in the processing region 103b.

Oxygen atom radicals contained in the processing gas supplied into the processing region 103b decompose organic substances adhering to the wafers 106 to remove the organic substances from the wafers 106. The organic substances thus removed from the wafers 106 are discharged through the discharge port 113 and the discharge pipe 114 outside the processing vessel 102 by suction.

The supply of the processing gas containing nitrogen gas, oxygen gas and ozone through the processing gas supply pipe 108 is stopped after the organic substances have been removed from the wafers 106. Subsequently the vacuum pump 116 is operated while the opening of the combination valve 115 is controlled to evacuate the processing chamber 103a, and then nitrogen gas is supplied at a predetermined flow rate of, for example, 10 l/min through the purge gas supply pipe 117 and the gases in the processing chamber 103a are discharged through the discharge pipe 114. Nitrogen is supplied through the purge gas supply pipe 117 into the processing chamber 103a for, for example, 10 min (Purging Step). Preferably, a purge cycle including supplying nitrogen gas into the processing chamber 103a and discharging gases from the processing chamber 103a is repeated plural times to ensure that the processing chamber 103a is purged of gases completely.

Then, nitrogen gas is supplied at a predetermined flow rate of, for example, 20 l/min for about 5.5 min last through the purge gas supply pipe 117 into the processing chamber 103a to set the processing chamber 103a at the normal pressure (760 torr), and the wafer boat 105 holding the wafers 106 is unloaded from the processing chamber 103a (Unloading Step).

Sample wafers 106 contaminated with organic substances were subjected to the cleaning process under various conditions. Sample wafers 106 contaminated with organic substances were prepared by forming a 1000 Å thick oxide film on each of wafers 106, cleaning the surfaces of the oxide films for 1 min with dilute hydrofluoric acid (DHF), and keeping the wafers 106 for 200 hr in a clean room.

Also in the experiments, the quantity of adhering organic substances was assessed by aforesaid contact angle method. Contact angles at five points on each sample wafer 106 were measured, and the means of the five measured contact angles was used. The contact angle at each sample wafers was 36°. The contact angle at a wafer 106 completely cleared of organic substances is not 0° and it is difficult to measure small contact angles precisely. Therefore, it was assumed that the wafers 106 were cleared substantially completely of organic substances when the contact angle was 2° or below.

TABLE 2

| | Temperature (° C.) | Pressure (Pa) | Time (min) | Ozone Concentration (vol %) | Addition Gas | Number of Wafers | Contact Angle (T) (deg) | Contact Angle (C) (deg) | Contact Angle (B) (deg) |
|---|---|---|---|---|---|---|---|---|---|
| Example-1 | 300 | 133 | 30 | 7.05 | $N_2$ | 3 | 1.4 | 1.2 | 1.1 |
| Example-2 | 400 | 133 | 30 | 7.05 | $N_2$ | 3 | 1.4 | 1.3 | 1.3 |
| Example-3 | 500 | 133 | 30 | 7.05 | $N_2$ | 3 | 1.5 | 1.3 | 1.3 |
| Example-4 | 600 | 133 | 30 | 7.05 | $N_2$ | 3 | 1.7 | 1.5 | 1.5 |
| Example-5 | 200 | 133 | 30 | 7.05 | $N_2$ | 3 | 10 | 10.5 | 11.6 |
| Example-6 | 200 | 26600 | 30 | 7.05 | $N_2$ | 3 | 1.7 | 1.7 | 1.9 |
| Example-7 | 300 | 26600 | 30 | 7.05 | $N_2$ | 3 | 1.4 | 1.4 | 1.3 |
| Example-8 | 300 | 133 | 5 | 7.05 | $N_2$ | 3 | 1.5 | 1.4 | 1.9 |
| Example-9 | 300 | 133 | 30 | 2.35 | $N_2$ | 3 | 1.7 | 1.6 | 1.8 |
| Example-10 | 300 | 133 | 30 | 14.1 | $N_2$ | 3 | 1.2 | 1.2 | 1.0 |
| Example-11 | 300 | 133 | 30 | 7.05 | $N_2$ | 100 | 1.5 | 1.2 | 1.3 |
| Example-12 | 300 | 133 | 30 | 7.05 | $CO_2$ | 3 | 2.0 | 1.3 | 1.3 |
| Example-13 | 300 | 133 | 30 | 7.05 | $CO_2$ | 100 | 2.0 | 1.3 | 1.5 |
| Comparative Example-1 | 600 | 133 | 30 | 0 | $N_2$ | 3 | 17.7 | 15.5 | 15.7 |
| Comparative Example-2 | RT | 133 | 30 | 7.05 | $N_2$ | 3 | 35 | 36.8 | 32.7 |
| Comparative Example-3 | 100 | 133 | 30 | 7.05 | $N_2$ | 3 | 29.1 | 28 | 28.2 |
| Comparative Example-4 | 300 | 133 | 30 | 0 | $N_2$ | 3 | 34.4 | 33.7 | 34.9 |
| Not-Processed | — | — | — | — | — | — | 35.5–36.2 | 35.5–36.2 | 35.5–36.2 |

Figure 6:
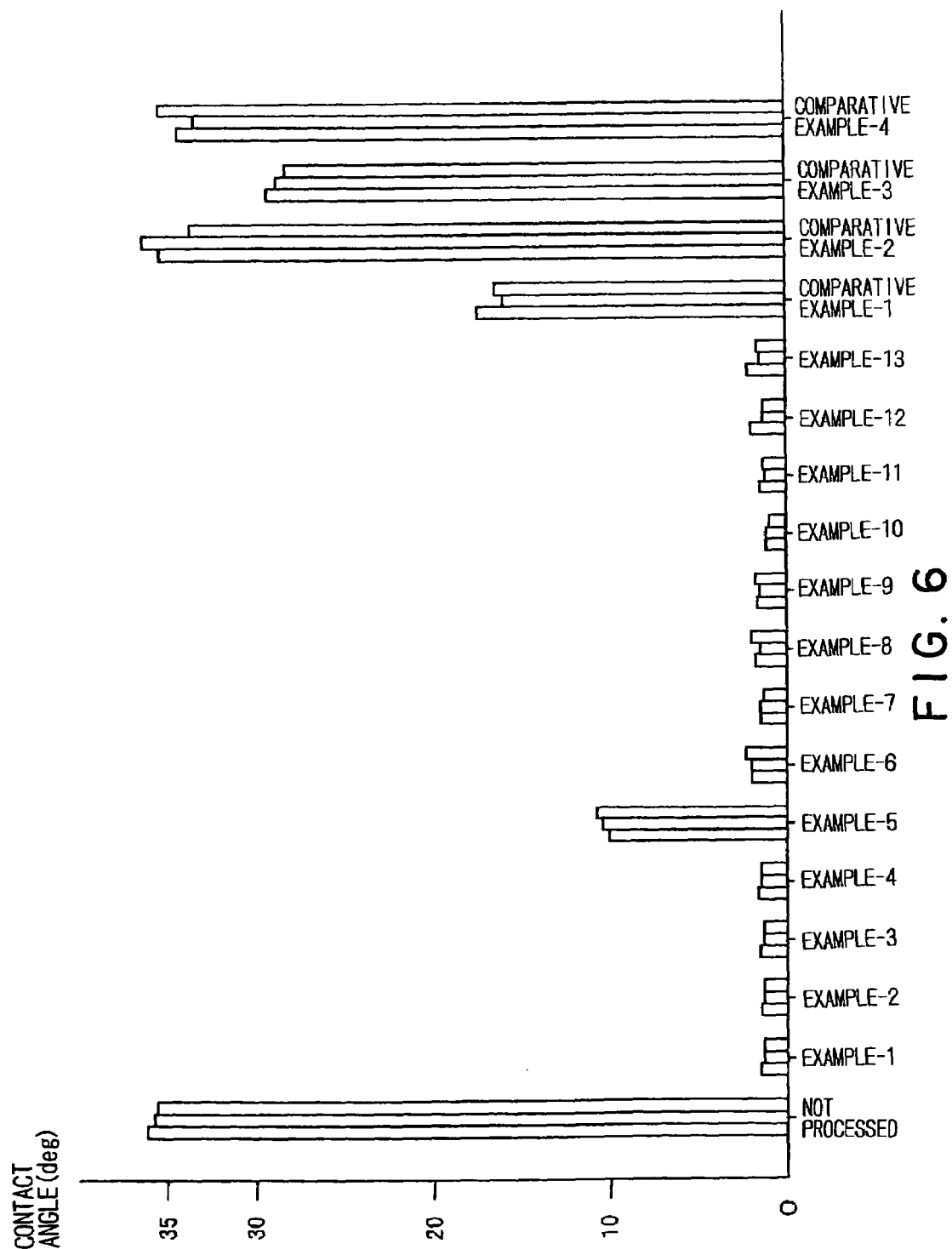
FIG. 6 is a graph showing the quantities of organic substances remaining on the wafers having been cleaned under respective cleaning conditions listed in Table 2.

Cleaning conditions are listed in Table 2. As shown in Table 2, the wafers in Examples 1 to 4 and Comparative examples 2 and 3 were cleaned by heating the processing chamber 103a at different temperatures, the wafers in Examples 7 were cleaned by setting the processing chamber 103a at an internal pressures, the wafers in Example 8 were cleaned for a cleaning time, the wafers in Examples 9 and 10 were cleaned by using processing gases of different ozone concentrations, and the wafers in Examples 12 and 13 were cleaned by using processing gasses respectively containing different addition gases to examine the influence of temperature, pressure and cleaning time on cleaning effect. To simplify experiments, three wafers 106 in each of the examples and the comparative examples, excluding Examples 11 and 13, were placed at a top position T, a middle position C and a bottom position B, respectively, on the wafer boat 9 for cleaning. The cleaning effect when many wafers 106 were cleaned simultaneously was represented by contact angles with the wafers 106 in Examples 11 and 13. Measured contact angles are shown in Table 2 and FIG. 6. In FIG. 6, sets each of three bars represent contact angles with the wafers 106 in examples and comparative examples. In each set of three bars, the left bar, the middle bar and the right bar represent contact angles respectively representing the amounts of organic substances adhering to the wafer 106 at the top position T, at the middle position C and the bottom position B, respectively. Data on wafers not cleaned, wafers cleaned by using oxygen gas (Comparative example 1) and wafers cleaned by the conventional cleaning method and heating the processing chamber 103*a* at a low temperature are shown in Table 2 and FIG. 6, for reference.

As obvious from data on Examples 1 to 4 and Comparative example 1 shown in Table 2 and FIG. 6, in the event that the temperature in the processing chamber 103*a* is in the range of 300° C. to 600° C., the amounts of residual organic substances on the wafers 106 in Examples 1 to 4 were about 1/10 of that of the residual organic substances on the wafers 106 in Comparative example 1. The contact angles with the wafers 106 in Examples 1 to 4 were 2° or below, which proved that the wafers 106 were substantially completely cleaned of organic substances and the thermal treatment method of the present invention is capable of more efficiently removing organic substances than the conventional cleaning method using oxygen gas.

As obvious from data on Examples 5 and 6 shown in Table 2 and FIG. 6, when the internal temperature of the processing chamber 103*a* was 200° C., the amount of the residual organic substances on the wafers 106 was about 1/3 of that of the residual organic substances on the wafers in Comparative example 1 cleaned by the conventional cleaning method using oxygen gas when the internal pressure of the processing chamber 103*a* was low (133 Pa), and the wafers were substantially completely cleaned of organic substances when the internal pressure of the cleaning chamber 103*a* is high (26600 Pa).

As obvious from data on Comparative examples 2 and 3 shown in Table 2 and FIG. 6, the wafers 106 could scarcely be cleaned of organic substances when the internal temperature of the processing chamber 103*a* was a room temperature RT or 100° C., because ozone contained in the processing gas was not activated and oxygen atom radicals were not produced and hence organic substances could not be decomposed when the internal temperature of the processing chamber 103*a* was excessively low. Thus, it is known from Table 2 and FIG. 6 that it is preferable that the internal temperature of the processing chamber 103*a* is in the range of 200° C. to 600° C.

Although the wafers 106 can substantially completely be cleared of organic substances by setting the processing chamber 103*a* at 26,600 Pa when the internal temperature of the processing chamber 103*a* is 200° C., the wafers 106 cannot substantially completely be cleared of organic substances by setting the processing chamber 103*a* at 133 Pa. Although the wafers 106 can substantially completely be cleared of organic substances when the internal temperature of the processing chamber 103*a* is higher than 600° C., the wafers 106 are subject to thermal oxidation in the processing chamber 103*a* at such a high temperature and the temperature condition of the processing chamber 103*a* is the same as the temperature at which the conventional cleaning method heats the processing chamber. Therefore, it is more preferable that the internal temperature of the processing chamber 103*a* is in the range of 300° C. to 500C.

As obvious from data on Examples 1 and 7 shown in Table 2 and FIG. 6, the wafers 106 could substantially completely be cleared of organic substances when the internal pressure of the processing chamber 103*a* was in the range of 133 to 26,600 Pa. The internal pressure of the processing chamber 103*a* higher than 26,600 Pa makes it difficult to distribute the processing gas uniformly in the processing region 103*b*. Therefore, it is preferable that the internal pressure of the processing chamber 103*a* is in the range of 133 to 26,600 Pa.

As obvious from data on Examples 1 and 8 shown in Table 2 and FIG. 6, the wafers 106 were substantially completely cleared of organic substances when the cleaning time was in the range of 5 to 30 min. There is the possibility that the wafers 106 cannot completely be cleared of organic substances if the cleaning time is shorter than 5 min. Wafers 106 cannot efficiently be cleaned if the cleaning time is longer than 30 min. Thus, it is preferable that the cleaning time is in the range of 5 to 30 min. However, the cleaning time may be extended beyond the upper limit of such a range or shortened below the lower limit of such a range depending on the amount of organic substances adhering to the wafers 106.

As obvious from data on Examples 1, 9 and 10 shown in Table 2 and FIG. 6, the processing gases having ozone concentrations in the range of 2.35% to 14.1% by volume were capable of substantially completely removing organic substances from the wafers 106. There is the possibility that the wafers 106 cannot substantially completely be cleared of organic substances when the ozone concentration is below 2.35% by volume. It is considered that the increase of the ozone concentration of the processing gas beyond 14.1% by volume is not effective in enhancing the organic substance removing ability of the processing gas. Thus, it is preferable that the ozone concentration of the processing gas is in the range of 2.35% to 14.1% by volume. However, the ozone concentration may be increased beyond such a range or reduced below such a range depending on the amount of organic substances adhering to the wafers 106.

As obvious from data on Examples 1 and 11 shown in Table 2 and FIG. 6, increase in the number of the wafers 106 held on the wafer boat 105 from three to hundred did not affect the cleaning effect of the cleaning method in clearing the wafers 106 of organic substances. The insusceptibility of the cleaning effect to the number of wafers held on the wafer boat 105 is due to the improved conductance in the processing chamber 103*a* and the low internal pressure of the processing chamber 103*a*. Thus, even if the number of simultaneously processed wafers 10 is large, such as hundred pieces, the influence of pressure of the reaction tube, cleaning time and the ozone concentration of the processing gas on cleaning effect is similar to that mentioned above.

As obvious from data on Examples 11 and 13 shown in Table 2 and FIG. 6, the change of the addition gas supplied through the addition gas supply pipe 112 from nitrogen to carbon dioxide did not affect the effect in removing organic substances from the wafers 106, and any $NO_x$ was contained in the processing gas generated by the ozone generator 109 when carbon dioxide was used as the addition gas. In addition, the corrosion of the processing gas supply pipe 108 for carrying the processing gas into the processing chamber 103*a* can be suppressed by using carbon dioxide gas.

Contact angle measurement is susceptible to the condition of a plane (the surface of the wafer 106) onto which a pure water drop is dropped and it is considered that the amount of organic substances adhering to the wafer 106 cannot accurately be measured if the cleaning process changes the shape of the surface of the wafer 106. The shapes of the surfaces of the wafers 106 were examined before and after processing the wafers by the cleaning process. The examination proved that the cleaning process changes the shapes of the surfaces of the wafers scarcely.

As apparent from the foregoing description, the batch type vertical thermal treatment apparatus 101 in the second embodiment is capable of removing organic substances adhering to wafers 106 from the wafers 106 more efficiently than the conventional cleaning apparatus using oxygen gas, by heating the processing chamber 103a at a temperature capable of activating ozone and supplying the processing gas containing ozone into the processing chamber 103a. When the processing chamber 103a is heated at a temperature in the range of 300 to 500° C. and the processing gas containing ozone is supplied into the processing chamber 103a, organic substances can be removed from the wafers 106 at an improved efficiency at a temperature lower than that used by the conventional cleaning method using oxygen gas.

According to the second embodiment of the present invention, the reaction vessel 102 is a single-wall structure and the space D is formed between the inner surface of the side wall of the reaction vessel 102 and the edges of the wafers 106. Therefore, ozone can easily be maintained in an activated state, the processing chamber 103a can easily be maintained at a low pressure, and the processing gas can uniformly be distributed in the processing region 103b. Thus, the plurality of wafers 106 can simultaneously be cleared of organic substances by a single cycle of the cleaning process.

In the batch type vertical thermal treatment apparatus 101 in the second embodiment, the tip part 108a of the processing gas supply pipe 108 is bent so as to jet the processing gas so that the processing gas jetted upward from the processing gas supply pipe 108 flows through a space outside the processing region 103b. Thus, conductance in the processing chamber 103a can be improved and the ozone can easily be maintained in an activated state, the processing chamber 103a can easily be maintained at a low pressure, and the processing gas can uniformly be distributed in the processing region 103b. Thus, the plurality of wafers 106 can simultaneously be cleared of organic substances by a single cycle of the cleaning process.

In the batch type vertical thermal treatment apparatus 101 in the second embodiment, the processing gas flows upward to the top wall of the processing vessel 102, and then the processing gas is caused to flow into the processing region 103b by the suction of the vacuum pump 116. Thus, the processing gas can be uniformly distributed in the processing region 103b.

In the batch type vertical thermal treatment apparatus 101 in the second embodiment, the ozone generating efficiency of the ozone generator 109 is improved by supplying nitrogen gas in addition to oxygen gas to the ozone generator 109.

[Third Embodiment]

A third embodiment of the present invention, in which organic substances adhering to wafers (i.e., objects to be processed) are decomposed and removed therefrom (namely, cleaned) by means of a processing gas containing ozone, and then silicon dioxide thin films are formed on the cleaned wafers by supplying steam onto the wafers, by using a batch type vertical thermal treatment apparatus shown in FIG. 7, will be described.

Figure 7:
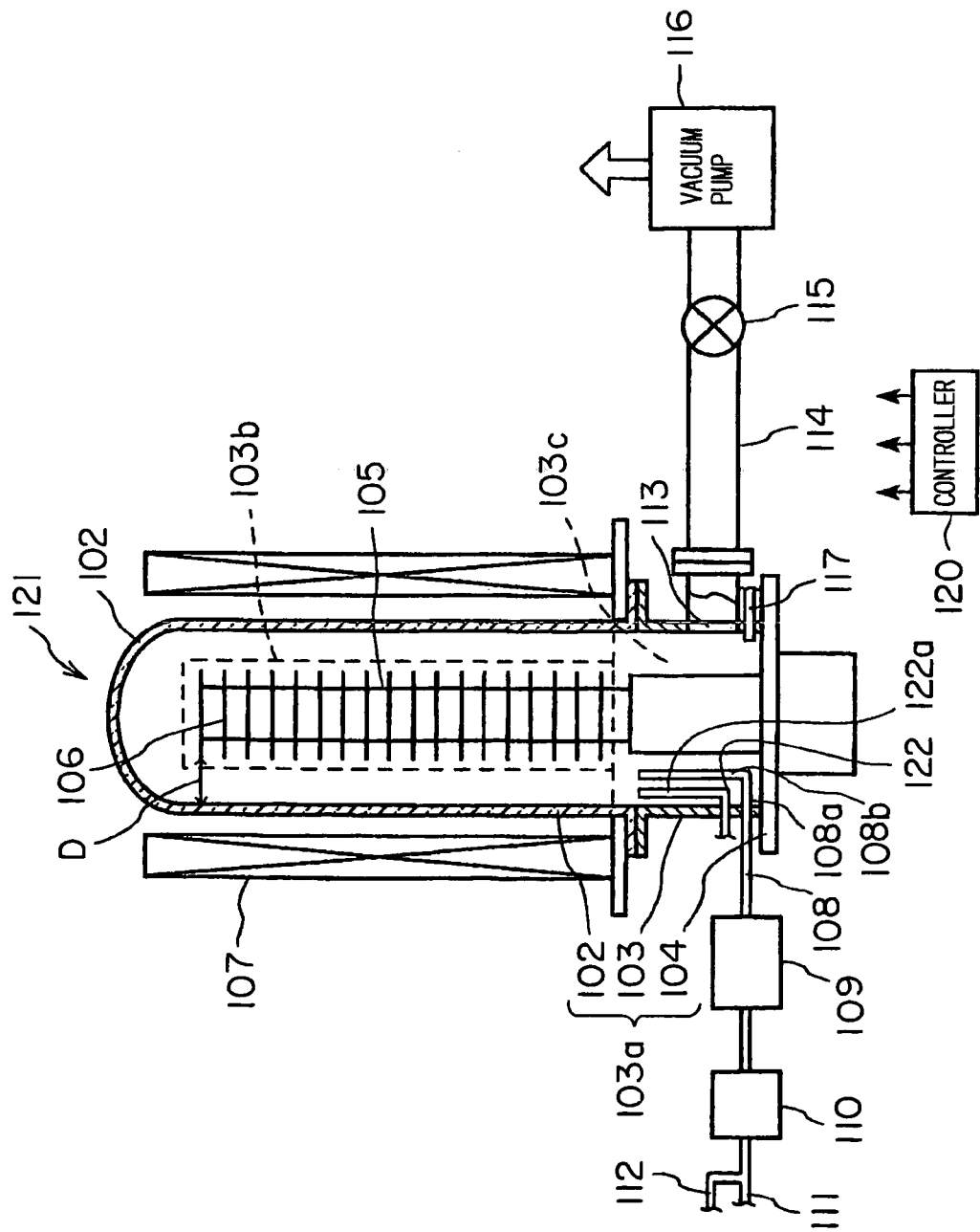
FIG. 7 is a schematic view of a processing apparatus in a third embodiment according to the present invention.

As obvious from FIG. 7, the thermal treatment apparatus 121 is substantially the same in construction as the thermal treatment apparatus 101 in the second embodiment, except that the former is provided additionally with a film-forming gas supply pipe 122 for carrying steam as a film-forming gas to cleaned wafers.

The film-forming gas supply pipe 122 penetrates the side wall of the manifold 103 into the non-processing region 103c. The film-forming gas supply pipe 122 is connected to a combustor, not shown. The combustor produces steam through the reaction of hydrogen gas and oxygen gas, and supplies the steam into the film-forming gas supply pipe 122. The film-forming gas supply pipe 122 is bent so that the tip part 122a thereof is directed toward the processing region 103b (upward). Thus, the film-forming gas supplied through the film-forming gas supply pipe 122 is jetted toward the upper portion in the reaction tube 102. The tip part 122a of the film-forming gas supply pipe 122 is arranged such that the film-forming gas jetted upward through the tip part 122a flows through the space D shown in FIG. 7 outside the processing region 103b into a space above the processing region 103b in the reaction vessel 102.

Description will be made of a method of cleaning wafers 106 contaminated with organic substances by using a processing gas containing ozone and then forming a silicon dioxide film (thin film) on the cleaned wafers 106 to be carried out by the thermal treatment apparatus 121 with reference to a sequence diagram shown in FIG. 8. A loading step, a stabilizing step and a cleaning step of the method are the same as those of the second embodiment. Thus, a first purge step and the following steps will be described. The controller 120 controls the operations of the components of the thermal treatment apparatus 121.

Figure 8:
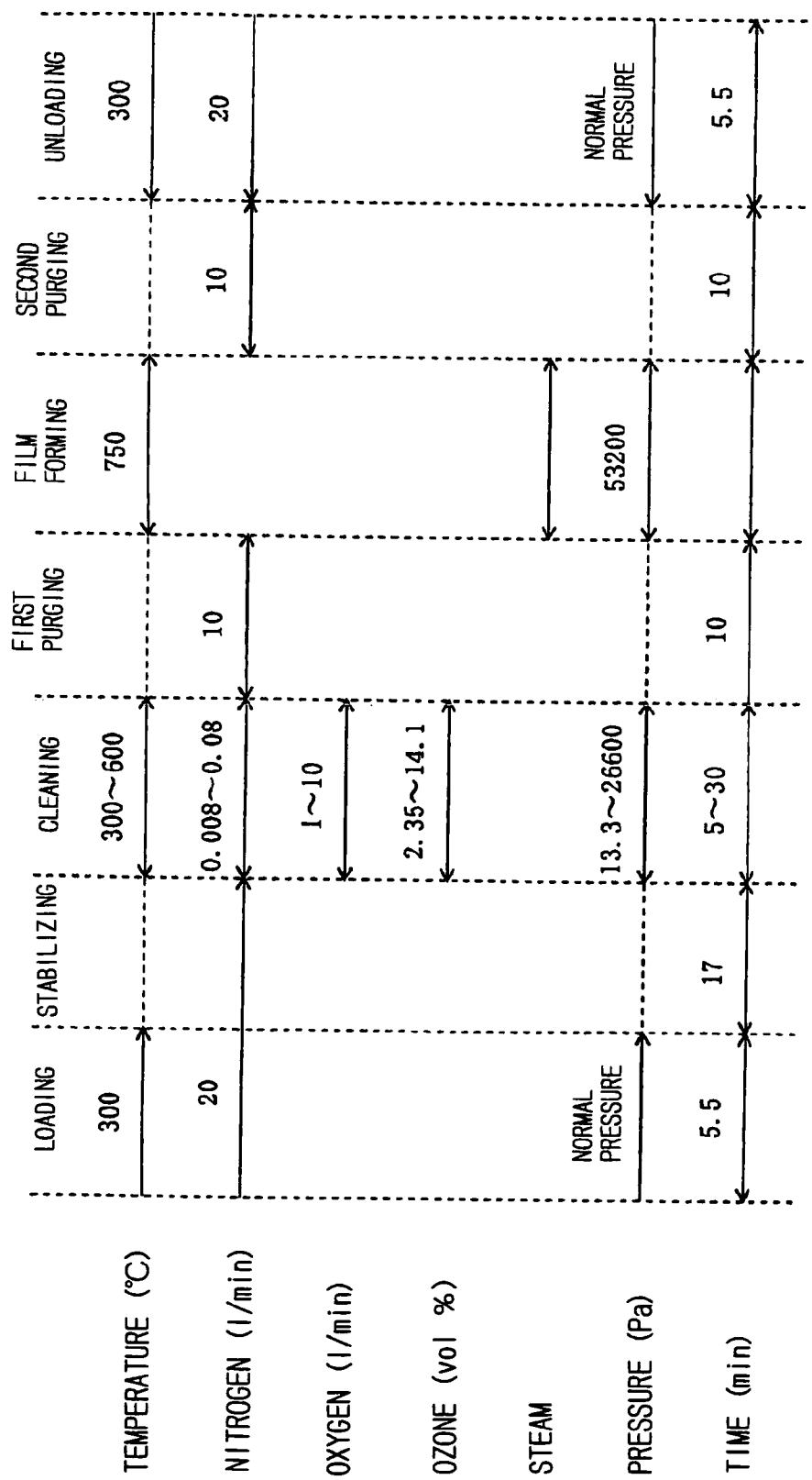
FIG. 8 is a diagram, showing a process recipe, of assistance in explaining a cleaning procedure and a film-forming procedure to be carried out by the wafer processing apparatus shown in FIG. 7.
Figure 9:
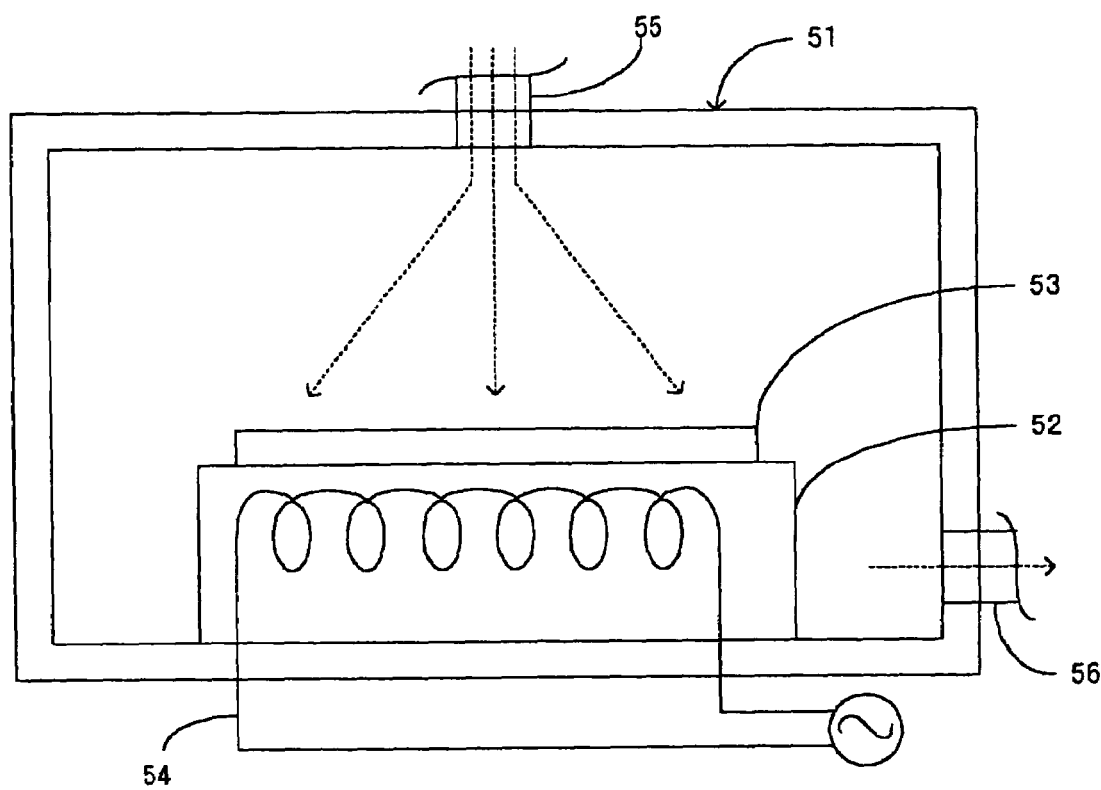
FIG. 9 is a typical view of a conventional processing apparatus.

Referring to FIG. 8, wafers 106 are cleared of organic substances by the loading step, the stabilizing step and the cleaning step. Then, the supply of the processing gas through the processing gas supply pipe 108 is stopped. Then, gases are discharged from the processing chamber 103a by controlling the opening of the combination valves 115 and operating the vacuum pump 116. Subsequently, nitrogen gas is supplied at a predetermined flow rate of, for example, 10 l/min through the purge gas supply pipe 117 into the processing chamber 103a and gases are discharged from the processing chamber 103a through the discharge pipe 114. The gases are discharged from the processing chamber 103a until the internal pressure of the processing chamber 103a coincides with a predetermined pressure of, for example, 53,200 Pa (400 torr). The heater 107 heats the processing chamber 103a at a predetermined temperature of, for example, 750° C. Evacuating and heating operations are continued until the processing chamber 103a is stabilized at a predetermined pressure and a predetermined temperature (First Purging Step).

The supply of nitrogen gas through the purge gas supply pipe 117 is stopped after the pressure chamber 103a has been stabilized at a predetermined pressure and a predetermined temperature. Then, steam is supplied into the reaction vessel 102 at a predetermined flow rate through the film-forming gas supply pipe 122 so that steam flows into a space under the top wall of the reaction vessel 102, i.e., a space extending above the wafer boat 105. The steam reached to space under the top wall of the reaction vessel 102 is caused to flow into the processing region 103b by the suction of the vacuum pump 116. The steam flowed into the processing region 103b oxidizes the wafers 106 to form a thin silicon dioxide film on the wafers 106 by wet oxidation(Thin-film forming step).

Since steam flows via the top wall of the reaction vessel 102 into the processing region 103b, steam can uniformly be distributed in the processing region 103b and thereby silicon dioxide films can uniformly be formed on the wafers 106.

Since the thermal treatment apparatus 121 carries out both the cleaning step of cleaning the wafers 106 of organic substances and the thin-film forming step of forming silicon dioxide films on the wafers, the silicon dioxide films can easily be formed on the wafers 106, respectively. Since the cleaned wafers 106 do not need to be carried before starting the thin-film forming step after the cleaning step, there is no possibility that the wafers 106 cleaned by the cleaning step are contaminated with organic substances before the same are subjected to the thin-film forming step.

The supply of steam through the film-forming gas supply pipe 122 is stopped after the silicon dioxide films have been formed on the wafers 106. The opening of the combination valve 115 is controlled, and the vacuum pump 116 is operated to evacuate the processing chamber 103a, and then nitrogen gas is supplied through the purge gas supply pipe 117 at a predetermined flow rate of, for example, 10 l/min to purge gases remaining in the processing chamber 103a through the discharge pipe 114. The supply of nitrogen gas through the purge gas supply pipe 117 is continued, for example, for 10 min (Second Purging Step). Preferably, a purge cycle including supplying nitrogen gas into the processing chamber 103a and discharging gases from the processing chamber 103a is repeated plural times to ensure that the processing chamber 103a is purged of gases completely.

Nitrogen gas is supplied last through the purge gas supply pipe 117 into the processing chamber 103a at a predetermined flow rate of, for example 20 l/min for abut 5.5 min to set the processing chamber 103a at the normal pressure (760 torr), and the wafer boat 105 holding the wafers 106 is unloaded from the processing chamber 103a (Unloading Step).

Possible modifications in the second and the third embodiment will be described.

Although the second embodiment uses the batch type vertical thermal treatment apparatus 101 to clear the wafers 106 of organic substances, a single-wafer thermal treatment apparatus may be used. Organic substances adhering to a wafer 106 can also efficiently be removed from the wafer 106 by the single-wafer thermal treatment apparatus at a low process temperature.

Although the third embodiment uses the thermal treatment apparatus 121 for both the cleaning step of removing organic substances from the wafers 106 and film-forming step of forming a silicon dioxide film on the wafers 106, the cleaning step and the film-forming step may be carried out by separate apparatuses, respectively.

Although the third embodiment applies steam to the wafers 106 cleared of organic substances to form a silicon dioxide film on the wafers 106, a silicon dioxide film may be formed by applying ozone to the wafers 106 cleared of organic substances. When ozone is used for oxidation, the film-forming gas supply pipe 122 may be omitted and hence the construction of the thermal treatment apparatus 121 can be simplified. Films other than silicon dioxide films, such as silicon nitride films may be formed on the wafers 106.

Although the reaction vessel 102 of single-wall construction defining the space D between the side wall thereof and the edges of the wafers 106 is used in the second and the third embodiment, a reaction vessel of any suitable construction, such as a reaction vessel of double-wall construction consisting of inner and outer tubes, may be used provided that the reaction vessel has a conductance capable of maintaining ozone in an activated state.

The processing gas supply pipe 108 (the film-forming gas supply pipe 122) is disposed in the non-processing region 103c, the processing gas (film-forming gas) is jetted so as to reach the top wall of the reaction vessel 102, and the processing gas (film-forming gas) is caused to flow into the processing region 103b by discharging gases from the processing chamber 103a in the second and the third embodiment. However, the processing gas supply pipe 108 (film-forming gas supply pipe 122) may be disposed near the top wall of the reaction vessel 102 to supply the processing gas (film-forming gas) into the processing region 103b.

The processing gas jetting part 8b of the processing gas supply pipe 108 (the tip part 122a of the film-forming gas supply pipe 122) extending in the non-processing region 103c in the second and the third embodiment may have any length longer or shorter than that shown in FIGS. 4 and 7. The processing gas jetting part 8b (the tip part 122a) may be a nozzle of a multiple-hole type (a distribution type).

Preferably, the loading temperature and the cleaning temperature are substantially equal. Preferably, the cleaning temperature in the second embodiment is 300° C. Any temperature adjusting operation is not necessary for the cleaning step when the cleaning temperature is 300° C.

In the second embodiment, the cleaning step may be performed while the reaction vessel is being heated from the loading temperature to the film-forming temperature. In such a case, the reaction vessel can be heated to the film-forming temperature during the cleaning step and thereby the time necessary to form the thin film on the wafers 106 can be reduced.

The apparatus for generating ozone is not limited to the ozone generator 109 to which oxygen gas, and nitrogen gas or carbon dioxide gas are supplied. For example, only the oxygen gas supply pipe 111 may be connected to the purifier 110 to supply only oxygen gas to the ozone generator 109. The ozone generator 109 is able to generate ozone even if only oxygen gas is supplied thereto.

The thermal treatment apparatus does not need to be provided with the single processing gas supply pipe 108 and the single film-forming gas supply pipe 122, the same may be provided with a plurality of processing gas supply pipes and a plurality of film-forming gas supply pipes. The objects, to be processed, are not limited to wafers and may be, for example, glass substrates.

The invention claimed is:

1. A method of processing an object, to be processed, comprising the steps of:
   loading the object contaminated with an organic substance into a reaction chamber; and
   heating the reaction chamber at a predetermined temperature and supplying a processing gas into the reaction chamber while maintaining the reaction chamber at a reduced pressure, thereby removing the organic substance from the object;
   wherein the processing gas contains an oxidizing gas and a reducing gas, and the predetermined temperature at which the reaction chamber is heated is high enough to activate the oxidizing gas and the reducing gas, and
   wherein said method is performed without producing an electric field, a magnetic field or an electromagnetic field in the reaction chamber.

2. The method according to claim 1, wherein the oxidizing gas contains at least one of $O_2$, $N_2O$ and $NO$, and the reducing gas contains at least one of $H_2$, $NH_3$ and $CH_4$.

3. The method according to claim 1, wherein the predetermined temperature at which the reaction chamber is heated is 350° C. or above.

4. The method according to claim 1, wherein the reduced pressure in the reaction chamber is in the range of 133 to 399 Pa.

5. The method according to claim 1, wherein the loading step loads a plurality of objects each contaminated with the organic substance into the reaction chamber.

6. The method according to claim 1, wherein: the processing gas consists of $O_2$ gas as the oxidizing gas and $H_2$ gas as the reduction gas, active oxygen radicals and active hydroxyl radicals are generated through reaction of the $O_2$ gas and the $H_2$ gas, and said radicals decompose the organic substances on the object to remove said organic substances.

7. The method according to claim 6, wherein the predetermined temperature at which the reaction chamber is heated is 350° C. or above, and the reduced pressure in the reaction chamber is in the range of 133 to 399 Pa.

* * * * *